United States Patent [19]
Hwang et al.

[11] Patent Number: 5,837,427
[45] Date of Patent: Nov. 17, 1998

[54] METHOD FOR MANUFACTURING BUILD-UP MULTI-LAYER PRINTED CIRCUIT BOARD

[75] Inventors: Se Meyung Hwang; Keon Yang Park; Young Hwan Shin, all of Taejeon-si, Rep. of Korea

[73] Assignee: Samsung Electro-Mechanics Co Co., Ltd., Kyongki-do, Rep. of Korea

[21] Appl. No.: 693,655

[22] Filed: Aug. 9, 1996

[30] Foreign Application Priority Data

Apr. 30, 1996 [KR] Rep. of Korea ................. 1996/13843

[51] Int. Cl.⁶ ................................. G03C 5/00; B05D 5/12
[52] U.S. Cl. ........................ 430/312; 430/313; 430/324; 430/329; 427/98
[58] Field of Search ..................... 430/312, 313, 430/324, 329; 427/98

[56] References Cited

U.S. PATENT DOCUMENTS

| | | | |
|---|---|---|---|
| 4,299,873 | 11/1981 | Ogihara et al. | 428/137 |
| 5,261,154 | 11/1993 | Ferrier et al. | 29/830 |
| 5,289,630 | 3/1994 | Ferrier et al. | 29/830 |
| 5,635,337 | 6/1997 | Bartha et al. | 430/323 |

FOREIGN PATENT DOCUMENTS 7-231171  8/1995  Japan.

Primary Examiner—Janet C. Baxter
Assistant Examiner—Rosemary Ashton
Attorney, Agent, or Firm—Lowe Hauptman Gopstein Gilman & Berner

[57] ABSTRACT

A method for manufacturing a build-up multi-layer printed circuit board is disclosed which is used in the mother board of a computer, camera-incorporated VTRs, MCMs (multi chip module), CSPs (chip size package) or portable phones. In the build-up multi-layer printed circuit board of the present invention, an inner-layer connecting state is improved. The multi-layer printed circuit board is manufactured by sequentially stacking insulating resin layers and circuit conductor layers based on a build-up method. That is, a first insulating resin layer is necessarily made to undergo an exposure and a development so as to form a first via hole 122. Then a second via hole 124 which is larger than the first via hole 122 is formed on a second insulating resin layer, thereby forming a final V shaped photo via hole 120. Thus build-up multi-layer printed circuit board is manufactured.

17 Claims, 5 Drawing Sheets

METHOD FOR MANUFACTURING BUILD-UP MULTI-LAYER PRINTED CIRCUIT BOARD

BACKGROUND OF THE INVENTION

1. Field of the Invention

The present invention relates to a method for manufacturing a build-up multi-layer printed circuit board which is used in the mother board of a computer, camera-incorporated VTRs, MCMs (multi chip module), CSPs (chip size package) or portable phones. Particularly the present invention relates to a method for manufacturing a build-up multi-layer printed circuit board in which an inner-layer connecting state is improved.

2. Description of the Prior Art

In accordance with the progress in the electronic parts and the parts installing techniques, studies are being briskly carried out to achieve a high density of the printed circuit board. Among them, a method for manufacturing a multi-layer printed circuit board based on a build-up method is widely used. Unlike the conventional BVH (blind via hole) method, this method is carried out in such a manner that insulating layers and circuit conductive layers are sequentially stacked, thereby forming a multi-layer circuit. Therefore, the printed circuit board based on the build-up method is simple to manufacture. Further, in the build-up multi-layer printed circuit board (to be called "build-up MLB" below), via holes for connecting the inner-layer circuits of the board can be easily formed. Further, the formation of an extremely small diameter via hole is possible, and the thickness of the conductor layer can be made thin, with the result that fine circuits can be easily formed.

Japanese Patent Application Laid-open No. Hei-7-231171 is an example of such a build-up MLB. As shown in FIGS. 1A to 1F, the manufacturing method of the above patent application is constituted as follows. That is, a first photosensitive insulating resin layer 14 is formed in a thickness of about 40 μm upon a conductive circuit board 10 on which an inner layer circuit 12 has been formed. Then an unexposed portion 15 larger than an intended via hole 20 and having a diameter of about 600 μm is formed with scattered light of 200 mj/cm². Then without carrying out a development, a second photosensitive resin layer 16 is formed in a thickness of about 30 μm. Thereafter, an unexposed portion 17 having a diameter of about 200 μm is exposed with an energy of 300 mj/cm². Then, an ultrasonic development is carried out by using 1,1,1-trichloroethane so as to form a photo via hole 20 having a thickness of about 70 μm. Then a UV curing, a thermal curing, the coarsening by means of chromic acid, and the formation of electroplating resist are carried out. Then thereupon, an outer conductive circuit layer 30 is formed through a non-electrolytic Cu electroplating, thereby manufacturing the build-up MLB.

However, in the above described method, without carrying out a development, a second exposure is carried out so as to form a via hole of about 200 μm upon a via hole of about 600 μm which has been formed by the first exposure. Then a development is carried out at one time. Therefore, as shown in FIGS. 1D–1E, an insufficient exposure portion 22 is formed due to the shortage of transfer of the exposure dose because of the thickness of the insulating resin. After the development, the shape of the tiny diameter via hole 20 becomes such that its entrance becomes narrow, and the inner layer circuit portion becomes wide. Due to such a shape of the hole, the electrolyte cannot be sufficiently supplied during the non-electrolytic Cu plating. Consequently, a plating weak portion 32 is formed, and therefore, the electroplating contact becomes very much unreliable.

In order to overcome this problem, if the exposure is excessively carried out, then the insulating resin can be cracked, and an over-curing is resulted. Consequently, non-development or reduction of the via hole diameter can occur. Further, due to the shape of the hole, the size of the via hole is limited to about 0.2 mm, and therefore, the via hole forming precision is lowered. Ultimately, the high density of the multi-layer printed circuit board becomes limited.

SUMMARY OF THE INVENTION

The present invention is intended to overcome the above described problems of the conventional techniques.

Therefore it is an object of the present invention to provide a build-up multi-layer printed circuit board in which the inner-layer connecting degree is improved during the manufacturing of the build-up multi-layer printed circuit board by stacking conductive circuit layers and photosensitive insulating resin in a sequential manner.

It is another object of the present invention to provide a high density build-up multi-layer printed circuit board in which a via hole having a diameter of 0.1 mm or less can be formed.

In achieving the above object, the method for manufacturing the build-up multi-layer printed circuit board according to the present invention includes the steps of:

carrying out a photo etching on a Copper clad laminate (substrate) 110 having identical thin films, so as to form a printed circuit pattern 112;

spreading a first photosensitive insulating resin layer 114 on a face of the substrate 110 having the pattern 112, pre-drying to pre-cure it, spreading another first photosensitive insulating resin 114 on the other face of the substrate, pre-drying to pre-cure it, attaching mask films (having unexposed portions) on the first photosensitive insulating resins layers (which are formed on the opposite faces of the substrate), and carrying out an exposure and a development, thereby forming a photo via hole 122;

spreading a second photosensitive insulating resin layer 116 on one of the first photosensitive insulating resin layers 114 (having the photo via hole 122), pre-drying it to pre-cure it, spreading another second photosensitive insulating resin layer 116 on the other one of the first photosensitive insulating resin layers 114 (having the photo via hole 122), pre-drying it to pre-cure it, attaching mask films (having unexposed portions) on the second photosensitive insulating resins layers (which are formed on the opposite faces of the substrate), and carrying out an exposure and a development, thereby forming a larger photo via hole 124;

finally drying and curing the first and second photosensitive insulating resin layers having the via holes;

carrying out an electroless Cu plating on the substrate (on which the first and second photosensitive insulating resin layers have been finally dried and cured), and carrying out an electrolytic Cu electroplating to form an electroplated layer 130.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENT

FIG. 2 is a schematic sectional view showing the process for manufacturing the build-up multi-layer printed circuit board according to the present invention.

Figures 2A, 2B, 2C, 2D, 2E, 2F, 2G, 2H, 2I:
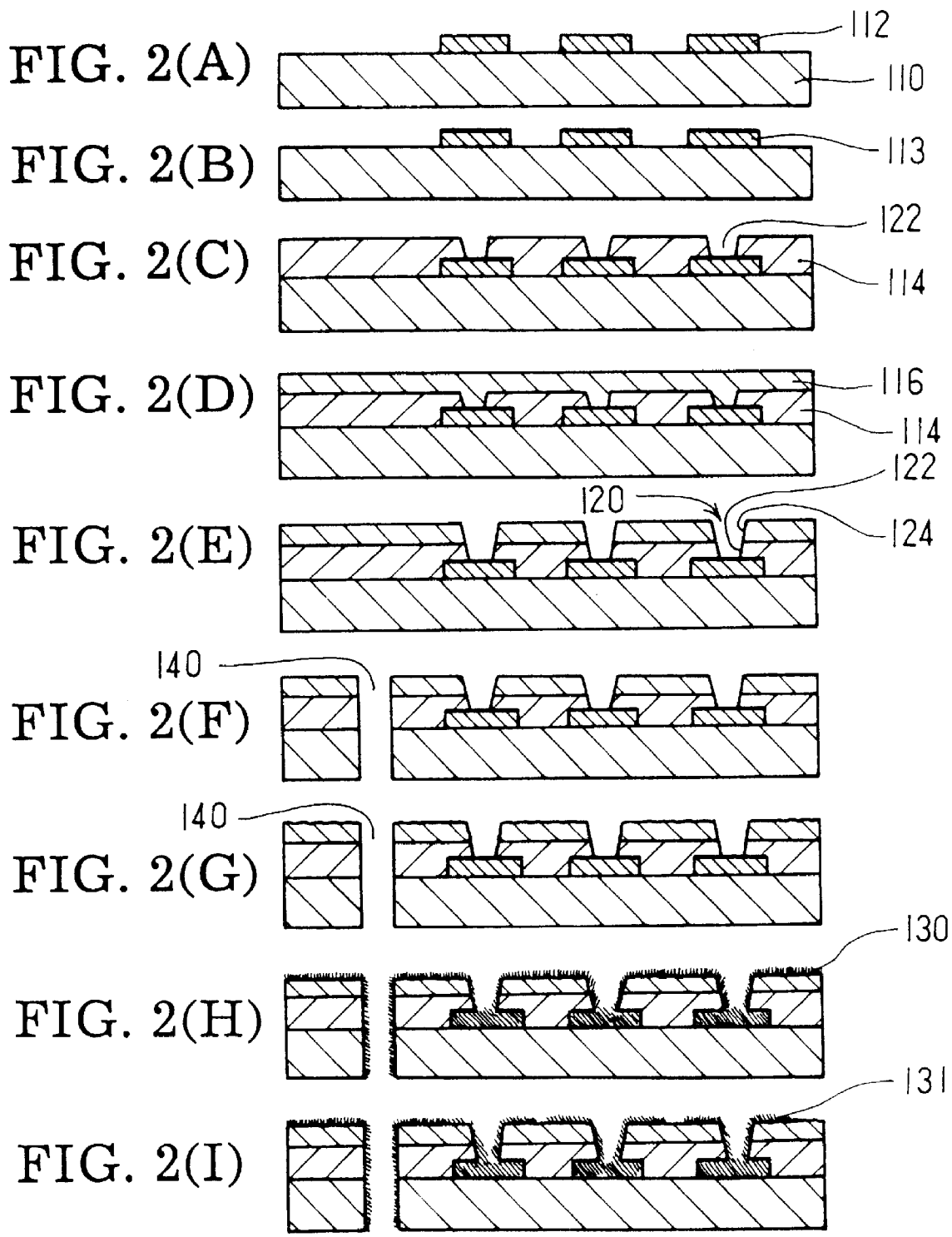
FIG. 2 is a schematic sectional view showing the process for manufacturing the build-up multi-layer printed circuit board according to the present invention.

First as shown in FIG. 2A, a photo etching is carried out on a copper clad laminate 110 on which Cu foils are attached on the opposite faces, thereby forming a printed circuit pattern 112. Under this condition, if a black oxide treatment is carried out as shown in FIG. 2B, the photosensitive insulating resin layers can be more firmly and closely attached on the pattern.

Thereafter, as shown in FIG. 2C–2H, photosensitive insulating resin layers 114 and 116 are formed on the substrate having the black oxide treated layer 113, and then, a photo via hole 120 is formed. Then a conductive circuit layer 130 is formed upon the resin layer. The resin layers are formed twice, i.e., first and second, in such a manner that the thickness of the resin layer should be about 17–115 $\mu$m.

If the thickness of the insulating resin layers 114 and 116 is less than 17 $\mu$m, then the insulating resistance is lowered. Consequently, signal interferences are not only liable to occur, but also the curves of the underlying circuit pattern are exposed, with the result that pockmarks of the circuit board will give problems in installing the components.

On the other hand, if the thickness of the insulating resin layers exceeds 115 $\mu$m, then the electroless Cu plating or the electro Cu plating on the inside of the via hole becomes difficult, and an undercut phenomenon becomes severe. Consequently, the Cu electroplating contact becomes unreliable, and there is no advantage in making the substrate thin.

Now the spreading process for forming the insulating resin layer will be described in detail below.

As shown in FIG. 2C, a photosensitive insulating resin layer 114 is spread in a proper thickness on the substrate 110 (having the black oxide treated layer 113) by using a screen fabric frame as a first operation, thereby screen printing one face. The pre-curing is carried out through a pre-drying. Further, another photosensitive insulating resin is spread on the other face (not shown in FIG. 2) in the same manner, and pre-cured through a pre-drying.

After spreading of the first photosensitive insulating resin layers 114, a positive mask film having an unexposed portion is vacuum-attached, and then is exposed, so that the portion of the pattern to be electrically connected to the inner layer would not be exposed.

Figure 1A:
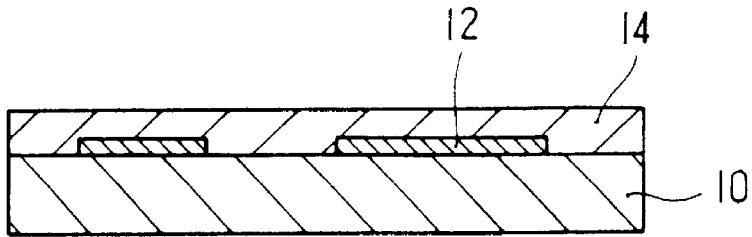
FIG. 1 is a schematic sectional view showing the conventional process for manufacturing the build-up multi-layer printed circuit board.
Figure 1B:
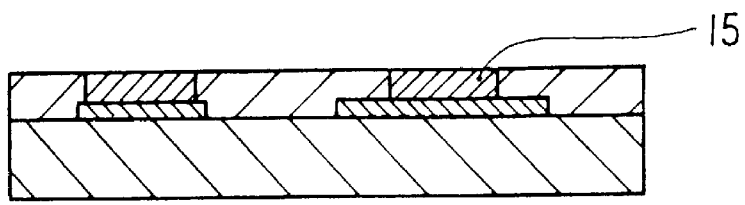
Figure 1C:
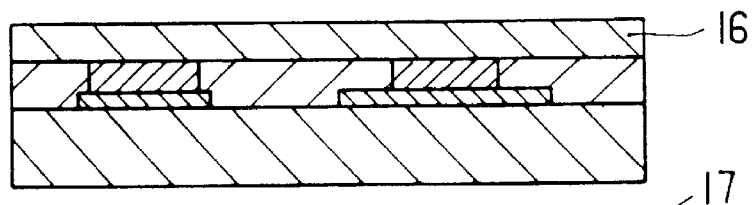
Figure 1D:
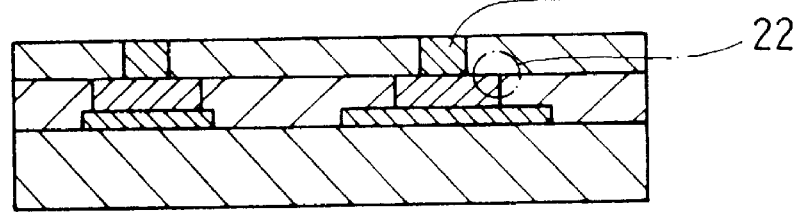
Figure 1E:
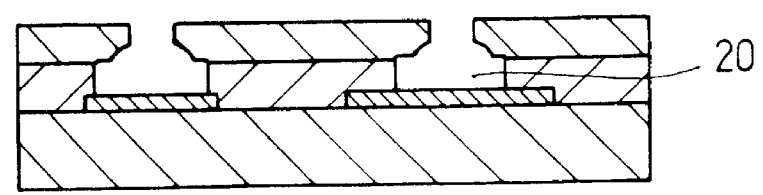
Figure 1F:
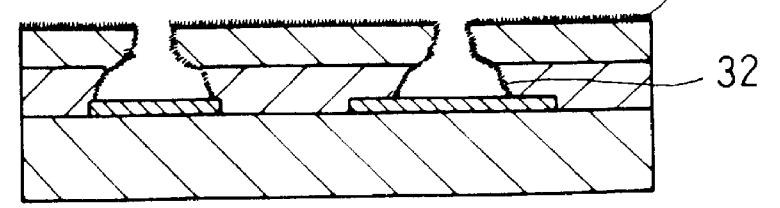

Then the unexposed portions of the photosensitive insulating resin layers are developed, thereby forming a V shaped photo via hole(tappered via hole) 122 as shown in FIG. 1C.

Then as shown in FIG. 2D, a spreading is carried out on the both faces of the substrate. That is, a second photosensitive insulating resin layer is spread on one of the first photosensitive insulating resin layers 114 having the photo via hole 122, in the same manner as in the first photosensitive insulating resin layers 114. Then a pre-curing is carried out through a pre-drying. Then another second photosensitive insulating resin layer is spread on another of the first photosensitive insulating resin layers 114 having the photo via hole 122, in the same manner as in the first photosensitive insulating resin layers 114. Then a pre-curing is carried out through a pre-drying, and then, an exposure is carried out.

Under this condition, the via hole 124 which has been formed through a second exposure should be larger than the via hole 122 of the first resin layer, if the final photo via holes 120 of the resin layers 114 and 116 are to be maintained in a V shape(tappered via hole) continuously as shown in FIG. 2E.

Figure 3:
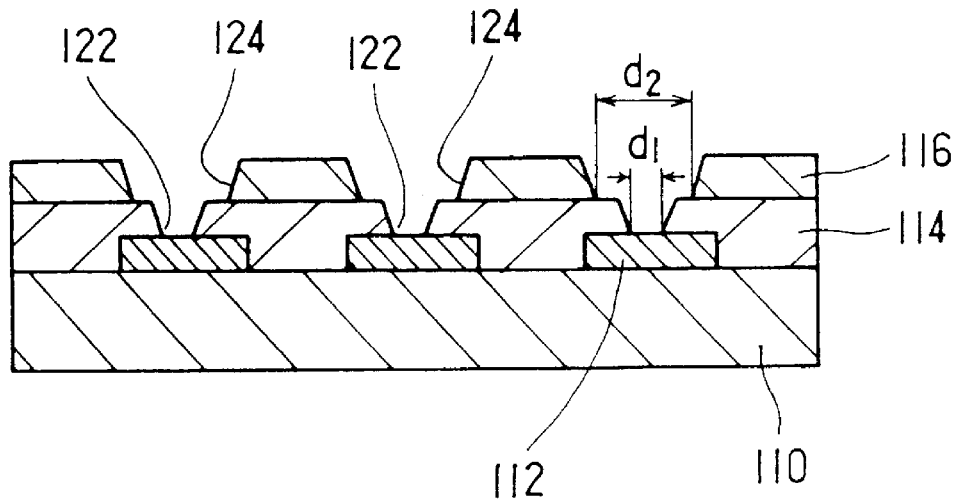
FIG. 3 illustrates the state of FIG. 2E.

Preferably, as shown in FIG. 3, a diameter $d_2$ of the via hole 124 which is formed through the second exposure and development should be 1.05 times as large as a diameter $d_1$ of the via hole 122 which is formed through the first exposure and development. More preferably, the former should be 1.05–20 times as large as the latter.

When the insulating resin layers and the circuit conductive layers are stacked based on the build-up method according to the present invention, the present invention is characterized as follows. That is, the first insulating resin layers are necessarily exposed and developed so as to form the first vis hole 122. Then the second via hole 124 having a larger size than that of the via hole 122 is formed on the second insulating resin layers, thereby finally forming a V shaped photo via hole(a tappered via hole) 120.

In the printed circuit board thus manufactured and having the V shaped via holes, not only the electroless Cu plating and the Cu electroplating (which is carried out later) can be done smoothly, but also the inter-layer contact reliability becomes superior.

Further, the second via hole is larger than the first via hole, and therefore, the problem of the inter-layer registration between the first photo via hole and the second photo via hole can be solved. Consequently, the deformation and eccentricity of the first and second via holes due to the non-registration of the via holes can be overcome, thereby improving the reliability of the printed circuit board.

The thickness ratio between the first and second photosensitive insulating resin layers should be preferably such that the thickness of the first photosensitive insulating resin layers : the thickness of the second photosensitive insulating resin layers=10–81:19–90.

If the thickness ratio of the first photosensitive insulating resin layers to the second photosensitive insulating resin layers is less than 10:90, then the thickness of the second photosensitive insulating resin layers becomes too thick. Consequently, during the second development, not the intended V shaped via hole but a via hole having a severe undercut is formed. Therefore, during the electroplating for the inter-layer conduction, the electroplating state on the bottom of the via hole is aggravated.

On the other hand, if the thickness ratio of the first photosensitive insulating resin layers to the second photosensitive insulating resin layers is larger than 81:19, then the thickness of the second photosensitive insulating resin layers becomes too thin. Consequently, the layer upon the Cu conductive circuit layer is too thin, and therefore, the thickness of the photosensitive insulating resin layer becomes insufficient. As a result, an insufficiency of inter-layer insulation is caused, thereby degrading the reliability of the product.

Meanwhile, in the present invention, the pre-drying which is carried out after forming the first and second photosensitive insulating resin layers is executed at a temperature of 50°–130° C. for 5–45 minutes.

If the drying temperature is below 50° C. or if the drying time is less than 5 minutes, the insulating resin within a solvent (butyl carbitol or butyl cellosolve) appears on the surface of the electroplated layer. Therefore, during the exposure, the incoming ultra-violet rays (UV rays) are impeded, and therefore, an insufficient exposure is resulted. Therefore, the formation of the via holes becomes difficult, and further, because of the sticking phenomenon, the exposing film is transcribed or sticked together.

On the other hand, if the drying temperature exceeds 130° C. or if the drying time is longer than 45 minutes, a over-reaction with reaction radicals within the photosensitive insulating resin layers occurs. Therefore, the development becomes difficult even after the irradiation of an optimum exposing light rays, with the result that the formation of the via holes becomes difficult.

Meanwhile, in the present invention, the exposing dose should be preferably 50–700 mj/cm$^2$, and the reason is as follows. If the exposing dose is less than 50 mj/cm$^2$, the reaction rate of the photosensitive insulating resin becomes insufficient, and therefore, it becomes difficult to form the photo via holes. On the other hand, if the exposing dose exceeds 700 mj/cm$^2$, an optical scattering occurs to the unexposed portions of the photosensitive insulating resin, and therefore, the photo via holes are reduced after the development. Further, due to the non-development, it becomes difficult to form the photo via holes.

Meanwhile, if the development time is less than 20 seconds, the unexposed portions of the photosensitive insulating resin is imperfectly developed, and therefore, an inter-layer insulation occurs during the Cu electroplating due to the residue photosensitive insulating resin. On the other hand, if the development time is more than 130 seconds, the undercut on the bottom of the via hole of the unexposed portion of the photosensitive insulating resin is deepened, and therefore, the electroplating quality of the bottom of the via hole is aggravated during the Cu electroplating for the inner-layer conduction.

Then as shown in FIG. 2F, a through hole 140 is formed for the inner-layer conduction based on the general method. Then as shown in FIG. 2G, the substrate on which the V shaped via hole 120 has been formed is provided with pockmarks so as to improve the electroplating adherence. Then an electroless Cu plating is carried out on the insulating layer based on the general method. Then an electrolytic Cu plating is carried out so as to form a circuit electroplated layer 130. Thus the electroplating adherence becomes acceptable even on the inside of the via hole 120, thereby ensuring the inner-layer contact. After the electroplated layer 130 is formed, a usual photo etching, an electroless Cu plating and an electrolytic Cu plating are carried out to form a pattern 131. Finally, a solder resist is spread, thereby obtaining the build-up MLB of the present invention. The build-up MLB thus obtained can have a via hole having a diameter of up to 0.05–0.4 mm. Particularly, the conventional problems such as the electroplating defects and the exposure insufficiency can be solved, thereby improving the product reliability.

Further, the build-up MLB which is manufactured based on the above described method can be applied to a multi-layer printed circuit board.

That is, the method of the present invention includes the steps of: forming photo via holes 122 and 124; finally drying and curing the first and second photosensitive insulating resin; carrying out an electroless Cu plating, and immediately carrying out an electrolytic Cu plating to form an electroplated layer; and forming a printed circuit pattern, whereby the above steps are repeated so as to form a build-up multi-layer printed circuit board.

Further, in the present invention, the build-up multi-layer printed circuit patterns are formed either on one face of the substrate, or are formed on the both sides of the substrate in a different number of layers, thereby obtaining the build-up multi-layer printed circuit board of the present invention.

Now the present invention will be described based on an actual example.

<EXAMPLE>

The example was implemented with an inventive method (inventive examples 1–4), a comparative method (comparative examples 1–5) and the conventional method. The latter two methods depart from the ranges of the present invention. The specific manufacturing conditions are as shown in Table 1 below. Further, the electroplatability and the like were evaluated, and the evaluated results are shown in Table 1 below.

Figure 4:
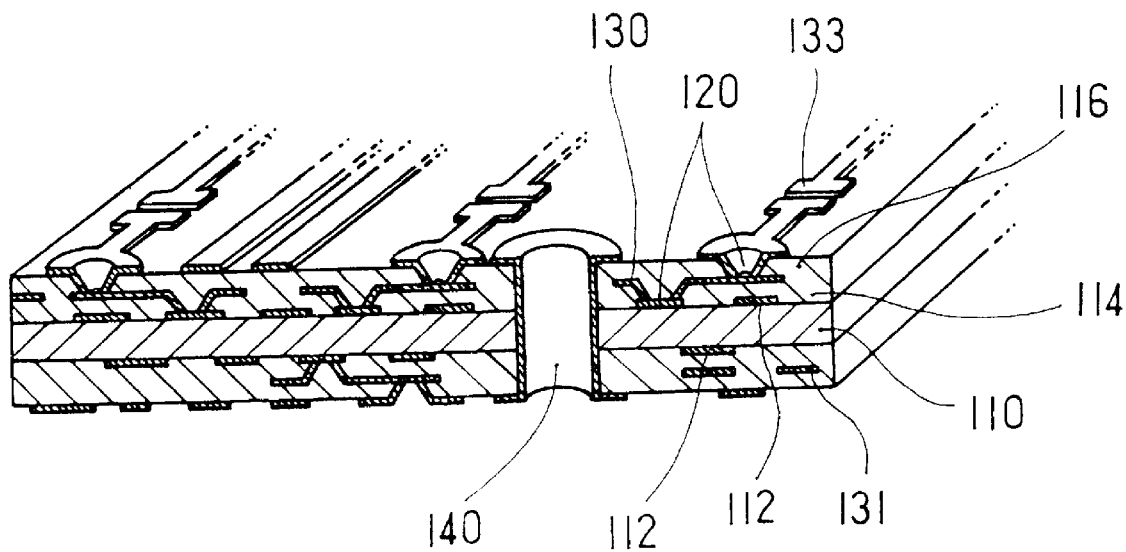
FIG. 4 is a cut-out perspective view showing the build-up multi-layer printed circuit board according to the present invention.

First, as shown in FIG. 4, a copper clad laminate (0.1 mm 18 μm/18 μm sheet of Polyclad company) on which Cu foils were attached on the both faces of it was subjected to a photo etching so as to form a printed circuit pattern 112. Then the pattern 112 was made to undergo a black oxide treatment. Then PREPREG (a product of Polyclad company) was put on each face and a 18 μm Cu foil was used. Then the usual stack-pressing process was applied so as to form a 4-layer substrate.

Then the general photo etching process was applied on the 18 μm Cu foil, thereby forming a printed circuit pattern. Then this circuit pattern was subjected to a black oxide treatment. Then a photosensitive insulating resin layer 114 was spread on the substrate 110 on which the black oxide treated layer had been formed. The insulating resin was spread through two rounds. That is, a first insulating resin was spread in thicknesses of 25 μm, 30 μm and 35 μm by using a printing fabric (SUS) of 100–150 meshes, thereby printing one face (1-1st screen printing). Then a pre-drying was carried out for 10–50 minutes within a drying furnace at a temperature of 45°–140° C., thereby carrying out a pre-cure.

Thereafter, the photosensitive insulating resin was spread in the above mentioned thicknesses by using the same screen printing fabric (2-1st screen printing). Then a pre-drying was carried out for 10–50 minutes at a temperature of 45°–140° C., thereby carrying out a pre-cure.

Then a positive mask film having a unexposed portion of 150–200 μm was vacuum-attached on the pre-cured first photosensitive insulating resin layer. Then an exposure was carried out with an energy of 85–750 mj/cm$^2$.

Thereafter, in a development line using a 1% Na$_2$CO$_3$ development fluid, a development was carried out on the via holes of the unexposed portion of the photosensitive insulating resin for 60–90 seconds with a spray pressure of 2.2 Kg/cm$^2$. Thus a V shaped first photo via hole was formed on the substrate.

In the case of the conventional example, the development was not carried out.

Then as shown in Table 1 below, an insulating resin was spread in a thickness of 25–35 μm upon the first insulating resin layer 114 on which the first photo via hole had been formed. Then a pre-drying was carried out to pre-cure it. Then a positive mask film having a unexposed portion of 200–250 μm was vacuum-attached on the pre-cured first photosensitive insulating resin layer. Then an exposure was carried out with an optical scattering energy of 155–350 mj/cm$^2$.

Then a water wash was carried out at a rate of 3 m/min in a water wash line of 3 m. Then a drying was carried out at about 150° C. for 30–60 minutes, and a UV curing was carried out with an energy of 1100 mj/cm$^2$, thereby forming a V shaped via hole 120.

Here, in the case of the comparative examples 1–4, PSR 4000 type SL-2 of Taiyo company was used as the photosensitive insulating resin. In the cases of the comparative example 5, the inventive examples 1 and 3 and the conventional example, PVI-500/SA-50 of Taiyo company was used. In the cases of the inventive examples 2 and 4, FINEDEL DSR-2000 ML-4 of Tamura company was used.

Thereafter, a through hole 140 was formed by using a mechanical drill, and then, Roughness of 1–3 μm were formed on the substrate on which the V shaped via hole 120 had been formed. Then an electroless Cu plating was carried out on the insulating layer with the general method, and immediately, an electrolytic Cu plating was carried out, thereby forming an electroplated layer of about 15 μm.

Then a photosensitive dry film was stacked on the electroplated layer 130, and then, an exposure and a development were carried out so as to form a pattern 131. Then a pattern electroplating was carried out, that is, an electrolytic Cu plating was carried out in a thickness of about 15 μm, and an Sn/Pb electroplating was carried out in a thickness of 10 μm, thereby forming an etching resist. Then the dry film was peeled off. Then an etching was carried out to remove the unnecessary Cu foil, and then, the Sn/Pb layer was peeled off. The above described process was repeated so as to form an outer printed circuit pattern 133, and then, finally a solder resist was spread, thereby manufacturing a build-up 6-layer MLB.

These build-up 6-layer MLBs were subjected to evaluations of the inner-layer contact reliability. The evaluation results were as follows. That is, the inventive examples 1–4 showed a uniform electroplating layer with 25 μm or more of Cu layer (JIS C 8461), and also showed a highly reliable inter-layer contact.

On the contrary, the comparative example 1 showed a working difficulty due to the stickiness which was caused by the insufficiency of the pre-drying. Meanwhile the comparative examples 2 and 3 showed an aggravation of the electroplating due to the severe undercut of the bottom of the photo via hole which was caused by the excessive exposure and the too lengthy exposing time. Further, the comparative example 5 showed a non-development and an impossibility of formation of the via hole due to an excessive pre-drying.

Further, in the case of the conventional material, the undercut on the bottom of the via hole was severe, and therefore, the electroplated layer on the bottom of the via hole was too thin and non-uniform.

Meanwhile, FIG. 5 is an optical micrograph showing the cross sections of the inventive examples 1 and 2 and the conventional example. In the cases of the inventive examples 1 and 2, the magnification ratio was 50 times, while the conventional examples was 500 times.

Figure 5A:
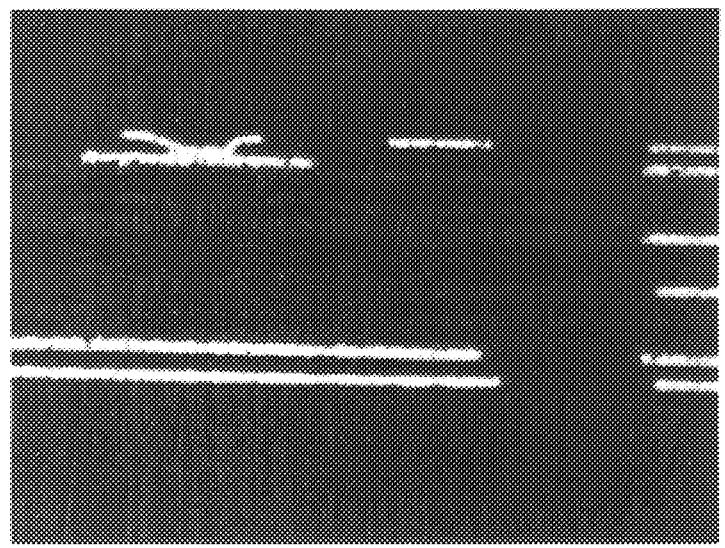
FIG. 5 is optical micrographs showing the cross sections of the printed circuit boards manufactured based on the conventional method and according to the present invention.
Figure 5B:
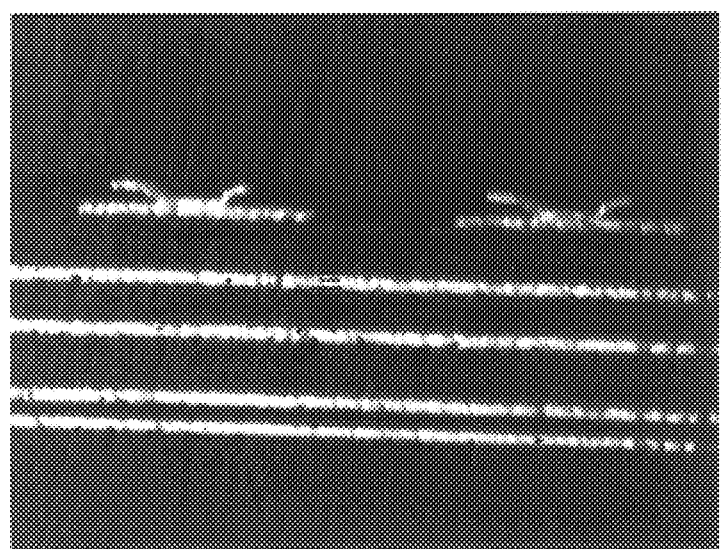
Figure 5C:

FIGS. 5A, 5B and 5C respectively illustrate the inventive examples 1 and 2 and the conventional example.

As shown in FIG. 5, in the cases of the inventive examples 1 and 2, a uniform electroplated layer was formed even within the via hole, while in the case of the conventional example, the electroplated layer is too thin and non-uniform within the via hole.

TABLE 1

| Manufacturing conditions | Comparative example 1 | Comparative example 2 | Comparative example 3 | Comparative example 4 | Comparative example 5 |
|---|---|---|---|---|---|
| Black oxide treatment | Done | Done | Done | Done | Done |
| 1-1st screen printing (thickness) | 30 μm | 30 μm | 25 μm | 30 μm | 30 μm |
| Pre-cure | 45° C. × 14 min | 80° C. × 25 min | 80° C. × 20 min | 80° C. × 50 min | 140° C. × 25 min |
| 2-1st screen printing (thickness) | 30 μm | 30 μm | 25 μm | 30 μm | 30 μm |
| Pre-cure | 45° C. × 14 min | 80° C. × 25 min | 80° C. × 40 min | 80° C. × 50 min | 140° C. × 25 min |
| Exposure |  |  |  |  |  |
| Exposure dose | 173 mj/cm$^2$ | 750 mj/cm$^2$ | 150 mj/cm$^2$ | 160 mj/cm$^2$ | 200 mj/cm$^2$ |
| Unexposed portion | 150 μm | 200 μm | 150 μm | 200 μm | 200 μm |
| Development |  |  |  |  |  |
| Time | 90 sec. | 90 sec. | 150 sec. | 90 sec. | 90 sec. |
| Development fluid | 1%Na$_2$CO$_3$ | 1%Na$_2$CO$_3$ | 1%Na$_2$CO$_3$ | 1%Na$_2$CO$_3$ | 1%Na$_2$CO$_3$ |
| Pressure | 2.2 kg/cm$^2$ | 2.2 kg/cm$^2$ | 2.2 kg/cm$^2$ | 2.2 kg/cm$^2$ | 2.2 kg/cm$^2$ |
| 1-2nd screen printing (thickness) | 30 μm | 30 μm | 25 μm | 30 μm | 30 μm |
| Pre-cure | 45° C. × 20 min | 80° C. × 35 min | 80° C. × 40 min | 80° C. × 50 min | 140° C. × 35 min |
| 2-2nd screen printing (thickness) | 30 μm | 30 μm | 25 μm | 30 μm | 30 μm |

TABLE 1-continued

| | | | | | |
|---|---|---|---|---|---|
| Pre-cure | 45° C. × 20 min | 80° C. × 35 min | 80° C. × 20 min | 80° C. × 50 min | 140° C. × 35 min |
| Exposure | | | | | |
| Exposure dose | 155 mj/cm$^2$ | 750 mj/cm$^2$ | 155 mj/cm$^2$ | 160 mj/cm$^2$ | 200 mj/cm$^2$ |
| Unexposed portion | 200 μm | 250 μm | 200 μm | 250 μm | 250 μm |
| Development | | | | | |
| Time | 60 sec | 90 sec | 150 sec | 60 sec | 90 sec |
| Development fluid | 1%Na$_2$CO$_3$ | 1%Na$_2$CO$_3$ | 1%Na$_2$CO$_3$ | 1%Na$_2$CO$_3$ | 1%Na$_2$CO$_3$ |
| Pressure | 2.2 kg/cm$^2$ | 2.2 kg/cm$^2$ | 2.2 kg/cm$^2$ | 2.2 kg/cm$^2$ | 2.2 kg/cm$^2$ |
| Final cure | 150° C. × 60 min | 150° C. × 60 min | 150° C. × 60 min | 150° C. × 60 min | 150° C. × 60 min |
| UV-cure | 1100 mj/cm$^2$ | 1100 mj/cm$^2$ | 1100 mj/cm$^2$ | 1100 mj/cm$^2$ | 1100 mj/cm$^2$ |
| Results | *(1) | *(2) | *(3) | *(4) | *(5) |

*(1) Due to the insufficiency of the pre-drying, a surface sticking occurred, and so, the workability was bad.
*(2) Due to the excessive exposure, a reduction of the size of the via hole and a non-development appeared, and so, the plating on the bottom of the via hole was poor due to the undercut.
*(3) Due to the excessive developing time, the undercut of the bottom of the via hole was deepened, and therefore, the plating reliability was aggravated.
*(4) Due to the excessive pre-drying, a non-development appeared during the exposure and development, and the via hole could not be formed.
*(5) Due to too high a pre-drying temperature, a non-development appeared, and the via hole could not be formed.

| | Example No. | | | | |
|---|---|---|---|---|---|
| Manufacturing conditions | Inventive example 1 | Inventive example 2 | Inventive example 3 | Inventive example 4 | Coventional example |
| Black oxide treatment | Done | Done | Done | Done | Non-done |
| 1-1st screen printing (thickness) | 30 μm | 30 μm | 25 μm | 30 μm | 30 μm |
| Pre-cure | 80° C. × 25 min | 80° C. × 10 min | 80° C. × 25 min | 80° C. × 15 min | 80° C. × 25 min |
| 2-1st screen printing (thickness) | 30 μm | 35 μm | 25 μm | 30 μm | 30 μm |
| Pre-cure | 80° C. × 25 min | 80° C. × 10 min | 80° C. × 25 min | 80° C. × 10 min | 80° C. × 35 min |
| Exposure | | | | | |
| Exposure dose | 100 mj/cm$^2$ | 300 mj/cm$^2$ | 85 mj/cm$^2$ | 350 mj/cm$^2$ | 100 mj/cm$^2$ |
| Unexposed portion | 200 μm | 200 μm | 200 μm | 200 μm | 200 μm |
| Development | | | | | |
| Time | 60 sec. | 60 sec. | 70 sec. | 60 sec. | Non-done |
| Development fluid | 1%Na$_2$CO$_3$ | 1%Na$_2$CO$_3$ | 1%Na$_2$CO$_3$ | 1%Na$_2$CO$_3$ | |
| Pressure | 2.2 kg/cm$^2$ | 2.2 kg/cm$^2$ | 2.2 kg/cm$^2$ | 2.2 kg/cm$^2$ | |
| 1-2nd screen printing (thickness) | 30 μm | 35 μm | 25 μm | 30 μm | 30 μm |
| Pre-cure | 80° C. × 35 min | 80° C. × 20 min | 80° C. × 35 min | 80° C. × 23 min | 80° C. × 35 min |
| 2-2nd screen printing (thickness) | 30 μm | 35 μm | 25 μm | 30 μm | 30 μm |
| Pre-cure | 80° C. × 35 min | 80° C. × 20 min | 80° C. × 35 min | 80° C. × 23 min | 80° C. × 35 min |
| Exposure | | | | | |
| Exposure dose | 155 mj/cm$^2$ | 300 mj/cm$^2$ | 130 mj/cm$^2$ | 350 mj/cm$^2$ | 155 mj/cm$^2$ |
| Unexposed portion | 250 μm | 250 μm | 250 μm | 250 μm | 250 μm |
| Development | | | | | |
| Time | 60 sec | 90 sec | 60 sec | 90 sec | 60 sec |
| Development fluid | 1%Na$_2$CO$_3$ | 1%Na$_2$CO$_3$ | 1%Na$_2$CO$_3$ | 1%Na$_2$CO$_3$ | 1%Na$_2$CO$_3$ |
| Pressure | 2.2 kg/cm$^2$ | 2.2 kg/cm$^2$ | 2.2 kg/cm$^2$ | 2.2 kg/cm$^2$ | 2.2 kg/cm$^2$ |

TABLE 1-continued

| Final cure | 150° C. × 60 min | 150° C. × 30 min | 150° C. × 60 min | 150° C. × 30 min | 150° C. × 60 min |
|---|---|---|---|---|---|
| UV-cure | 1100 mj/cm$^2$ | 1100 mj/cm$^2$ | 1100 mj/cm$^2$ | 1100 mj/cm$^2$ | 1100 mj/cm$^2$ |
| Results | *(1) | *(2) | *(3) | *(4) | *(a) |

*(1) A V-shaped via hole was formed, and a superior plating was secured.
*(2) A V-shaped via hole was formed, and a superior plating was secured.
*(3) A V-shaped via hole was formed, and a superior plating was secured.
*(4) A V-shaped via hole was formed, and a superior plating was secured.
*(a) the undercut on the bottom of the via hole was deepened, and therefore, the plating within the via hole was insufficient.

According to the present invention as described above, a build-up method of stacking insulating resin layers and circuit conductor layers in a sequential manner is used. Therefore, when manufacturing a multi-layer printed circuit board, a first insulating resin layer is subjected to an exposure and development so as to form a first via hole. Then a second via hole larger than the first via hole is formed on a second insulating resin layer to form a final V shaped photo via hole 120. Therefore, the unexposed portion can be easily adjusted, so that a high reliability build-up task can be carried out. Further, not only the Cu electroplating can be acceptably carried out, but also the inner-layer contact is superior.

What is claimed is:

1. A method for manufacturing a build-up multi-layer printed circuit board, comprising the steps of:

photo etching a printed circuit pattern on a copper clad substrate;

spreading a first photosensitive insulating resin layer on a face of said substrate having said pattern, pre-drying it at a temperature of 50°–130° C. for 5–45 minutes to pre-cure, spreading another first photosensitive insulating resin on another face of said substrate, pre-drying it at a temperature of 50°–130° C. for 5–45 minutes to pre-cure, attaching mask films having unexposed portions on said first photosensitive insulating resin layers which are formed on the opposite faces of said substrate, and carrying out an exposure with an energy of 50–700 mj/cm$^2$ and a development for 20–130 seconds, thereby forming a first photo via hole having a diameter of 0.05–0.4 mm;

spreading a second photosensitive insulating resin layer on one of said first photosensitive insulating resin layers having said photo via hole, pre-drying it at a temperature of 50°–130° C. for 5–45 minutes to pre-cure, spreading another second photosensitive insulating resin layer on the other one of said first photosensitive insulating resin layers having said photo via hole, pre-drying it at a temperature of 50°–130° C. for 5–45 minutes to pre-cure, attaching mask films having unexposed portions on said second photosensitive insulating resin layers which are formed on the opposite faces of said substrates, and carrying out an exposure with an energy of 50–700 mj/cm$^2$ and a development for 20–130 seconds, thereby forming a second photo via hole larger than the first via hole; and finally drying and curing said first and second photosensitive insulating resin layers having said first and second via holes;

carrying out an electroless Cu plating on said substrate on which said first and second photosensitive insulating resin layers have been finally dried and cured, and carrying out an electrolytic Cu electroplating to form an electroplated layer.

2. The method as claimed in claim 1, wherein the step of forming said first and second photo via holes, the step of finally drying and curing said first and second photosensitive insulating resin layers after forming said first and second via holes, and the step of carrying out a non-electrolytic electroplating and an electrolytic electroplating so as to form an electroplated layer, and so as to form a printed circuit pattern are repeatedly carried out, whereby a multi-layer printed circuit pattern is formed based on a build-up.

3. The method as claimed in claim 2, wherein said multi-layer printed circuit pattern based on the build-up is formed only on one face of said substrate.

4. The method as claimed in claim 2, wherein said multi-layer printed circuit pattern based on the build-up is formed on both faces of said substrate in a different number of layers.

5. The method as claimed in claim 1, wherein, prior to spreading said photosensitive insulating resin, said printed circuit pattern is subjected to a black oxide treatment or to a brown oxide treatment.

6. The method as claimed in claim 5, wherein said first and second photosensitive insulating resin layers on one face of said substrate has a thickness of 17–115 $\mu$m.

7. The method as claimed in claim 6, wherein said via holes formed on said first and second photosensitive insulating resin layers have a V shaped coupling.

8. The method as claimed in claim 6, wherein said first and second photosensitive insulating resin layers have a thickness ratio such that thickness of said first photosensitive insulating resin layer:thickness of said second photosensitive insulating resin layer=10–81:19–90.

9. The method as claimed in claim 5, wherein said via holes formed on said first and second photosensitive insulating resin layers have a V shaped coupling.

10. The method as claimed in claim 9, wherein said second via hole of said second insulating resin layer has a diameter($d_2$) 1.05 times as large as the diameter($d^1$) of said first via hole of said first insulating resin layer.

11. The method as claimed in claim 10, wherein said second via hole of said second insulating resin layer has a diameter 1.05–20 times as large as the diameter of said first via hole of said first insulating resin layer.

12. The method as claimed in claim 1, wherein said first and second photosensitive insulating resin layers on one face of said substrate has a thickness of 17–115 $\mu$m.

13. The method as claimed in claim 12, wherein said via holes formed on said first and second photosensitive insulating resin layers have a V shaped coupling.

14. The method as claimed in claim 12, wherein said first and second photosensitive insulating resin layers have a thickness ratio such that thickness of said first photosensitive insulating resin layer:thickness of said second photosensitive insulating resin layer=10–81:19–90.

15. The method as claimed in claim 1, wherein said via holes formed on said first and second photosensitive insulating resin layers have a V shaped coupling.

16. The method as claimed in claim 15, wherein said second via hole of said second insulating resin layer has a diameter($d_2$) 1.05 times as large as the diameter($d_1$) of said first via hole of said first insulating resin layer.

17. The method as claimed in claim 16, wherein said second via hole of said second insulating resin layer has a diameter 1.05–20 times as large as the diameter of said first via hole of said first insulating resin layer.

* * * * *